(12) United States Patent
Hong et al.

(10) Patent No.: US 11,038,019 B2
(45) Date of Patent: Jun. 15, 2021

(54) POWER SEMICONDUCTOR DEVICE AND METHOD FOR MANUFACTURING THE SAME

(71) Applicant: Magnachip Semiconductor, Ltd., Cheongju-si (KR)

(72) Inventors: Seong Jo Hong, Bucheon-si (KR); Soo Chang Kang, Seoul (KR); Ha Yong Yang, Cheongju-si (KR); Young Ho Seo, Sejong-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/738,044

(22) Filed: Jan. 9, 2020

(65) Prior Publication Data

US 2020/0144366 A1 May 7, 2020

Related U.S. Application Data

(62) Division of application No. 15/961,322, filed on Apr. 24, 2018, now Pat. No. 10,593,758.

(30) Foreign Application Priority Data

Jan. 30, 2018 (KR) .................. 10-2018-0011648

(51) Int. Cl.
*H01L 29/08* (2006.01)
*H01L 29/78* (2006.01)
(Continued)

(52) U.S. Cl.
CPC ........ *H01L 29/0865* (2013.01); *H01L 21/266* (2013.01); *H01L 29/0646* (2013.01);
(Continued)

(58) Field of Classification Search
None
See application file for complete search history.

(56) References Cited

U.S. PATENT DOCUMENTS

2005/0161734 A1 7/2005 Miyata et al.
2010/0176446 A1 7/2010 Hsieh

FOREIGN PATENT DOCUMENTS

JP 2005-116649 A 4/2005
JP 2009-266961 A 11/2009
KR 10-2016-0092866 A 8/2016

OTHER PUBLICATIONS

Korean Office Action dated Feb. 21, 2019 in counterpart Korean Patent Application No. 10-2018-011648 (7 pages, in Korean).

*Primary Examiner* — Moazzam Hossain
*Assistant Examiner* — Stanetta D Isaac
(74) *Attorney, Agent, or Firm* — NSIP Law

(57) ABSTRACT

A method for manufacturing a power semiconductor device includes forming a trench in a semiconductor substrate, forming a gate insulation film and a gate electrode in the trench, implanting a first conductivity type impurity into the semiconductor substrate to form a first conductivity type body region, implanting a second conductivity type impurity onto a surface of the semiconductor substrate to form a second conductivity type source region, forming an interlayer insulation film in the trench, implanting the first conductivity type impurity onto the surface of the semiconductor substrate to form a first conductivity type highly doped body contact region, exposing a portion of a side surface of the trench, and forming a source metal to be in contact with the exposed side surface of the trench.

18 Claims, 15 Drawing Sheets

(51) Int. Cl.
*H01L 29/06* (2006.01)
*H01L 21/266* (2006.01)
*H01L 29/66* (2006.01)
*H01L 29/10* (2006.01)

(52) U.S. Cl.
CPC .... *H01L 29/1095* (2013.01); *H01L 29/66727* (2013.01); *H01L 29/66734* (2013.01); *H01L 29/7813* (2013.01)

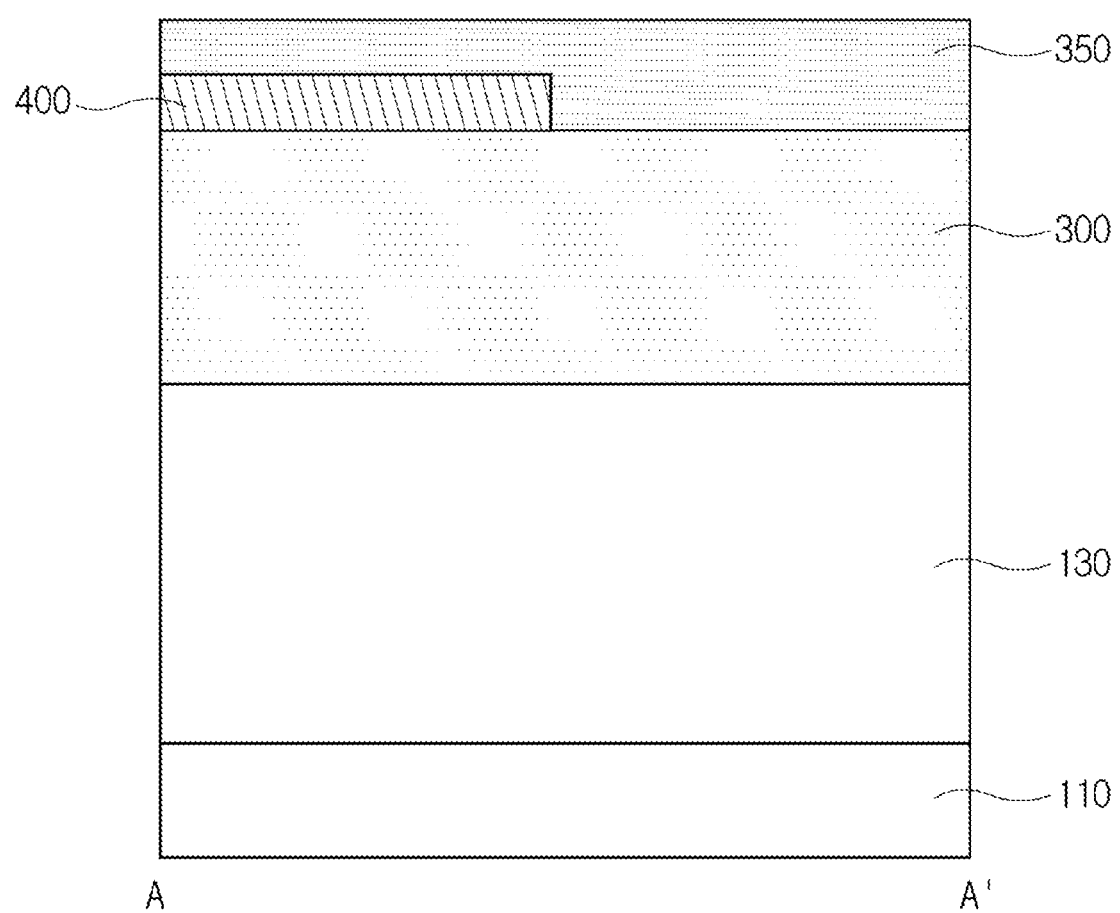

POWER SEMICONDUCTOR DEVICE AND METHOD FOR MANUFACTURING THE SAME

CROSS-REFERENCE TO RELATED APPLICATIONS

This application is a division of application Ser. No. 15/961,322 filed on Apr. 24, 2018, which claims the benefit under 35 USC 119(a) of Korean Patent Application No. 10-2018-0011648 filed on Jan. 30, 2018 in the Korean Intellectual Property Office, the entire disclosures of which are incorporated herein by reference for all purposes.

BACKGROUND

1. Field

The following description relates to a power semiconductor device in which a snapback phenomenon and a cell pitch are reduced. The following description also relates to a method for manufacturing such a power semiconductor device.

2. Description of Related Art

With the spread of mobile devices, techniques related to batteries supplying power to the mobile devices are becoming increasingly important. In recent years, a secondary battery capable of being discharged or charged is commonly used according to the purpose of supplying power to the mobile devices. Accordingly, a battery protection circuit configured to manage a voltage and a current required for discharging and charging of the battery, according to a battery specification, should be provided in the secondary battery.

Accordingly, the battery protection circuit may further perform functions such as a run time prediction and other similar functions, as well as a function of controlling charging and discharging of voltage and current. In order to implement the above-described functions, the battery protection circuit may be configured by connecting one or more cells in series or in parallel.

Because a battery protection circuit serves as a gate for passing or blocking a current, according to whether charging or discharging of the secondary battery is occurring, the battery protection circuit is required to have a relatively low resistance value when activated to allow passage of a current and is required to have high breakdown voltage performance when not activated to block a current, so as to prevent breakdown even at a high voltage of operation.

A power semiconductor device having a trench and employed in such a battery protection circuit is widely used as a component to constitute the battery protection circuit, because of an advantage in that low on-resistance ($R_{on}$) may be implemented through such a high integration. However, a snapback phenomenon may occur in an alternative power semiconductor device due to usage of a parasitic NPN transistor. In such an example, there is an issue in that such a snapback phenomenon induces a breakdown voltage lower than a designed breakdown voltage ($BV_{dss}$), leading to the deterioration of operational characteristics of the alternative power semiconductor device.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for manufacturing a power semiconductor device includes forming a trench in a semiconductor substrate, forming a gate insulation film and a gate electrode in the trench, implanting a first conductivity type impurity into the semiconductor substrate to form a first conductivity type body region, implanting a second conductivity type impurity onto a surface of the semiconductor substrate to form a second conductivity type source region, forming an interlayer insulation film in the trench, implanting the first conductivity type impurity onto the surface of the semiconductor substrate to form a first conductivity type highly doped body contact region, exposing a portion of a side surface of the trench, and forming a source metal to be in contact with the exposed side surface of the trench.

The exposing of the portion of the side surface of the trench may include etching a portion of the interlayer insulation film to simultaneously expose the second conductivity type source region and the first conductivity type highly doped body contact region, and the interlayer insulation film may be provided at only an interior of the trench.

Only the first conductivity type highly doped body contact region may be exposed to a top surface of a mesa region that is defined between the trench and another trench.

The first conductivity type highly doped body contact region and the second conductivity type source region may be exposed to a top surface of a mesa region that is defined between the trench and another trench.

The exposing of the portion of the side surface of the trench may include etching the portion of the interlayer insulation film using blank etching without a separate mask.

The second conductivity type source region may be formed and spaced apart by a distance from a top surface of a mesa region, defined between the trench and another trench, along the side surface of the trench.

The source metal may be formed to be in contact with the side surface of the trench, the second conductivity type source region, and the first conductivity type highly doped body contact region.

In another general aspect, a power semiconductor device includes a semiconductor substrate, trenches formed in the semiconductor substrate, a mesa region defined between each of the trenches, a gate insulation film provided on an inner wall of each of the trenches, a gate electrode provided on the gate insulation film, a first conductivity type highly doped body contact region provided at an upper portion of the mesa region, a second conductivity type source region spaced apart from a top surface of the mesa region by a distance and disposed along a side surface of each of the trenches, a first conductivity type body region provided to be in contact with the first conductivity type highly doped body contact region and the second conductivity type source region, and a source metal provided to be in contact with a side surface of the mesa region, the second conductivity type source region, and the first conductivity type highly doped body contact region.

The first conductivity type highly doped body contact region and the second conductivity type source region may be in contact with the side surface of each of the trenches.

The device may further include an interlayer insulation film provided at an interior of each of the trenches.

The source metal may be in contact with the interlayer insulation film.

A height level of an uppermost portion of the interlayer insulation film may be lower than that of an uppermost portion of the second conductivity type source region.

The second conductivity type source region may be provided to extend into a depth direction of each of the trenches, along the side surface of each of the trenches.

Only the first conductivity type highly doped body contact region may be exposed through the top surface of the mesa region.

The second conductivity type source region and the first conductivity type highly doped body contact region may be exposed through the top surface of the mesa region.

The second conductivity type source region provided at one trench among the trenches may be spaced apart from the second conductivity type source region provided at a trench adjacent to the one trench.

The gate electrode may be connected to a gate pad.

Other features and aspects will be apparent from the following detailed description, the drawings, and the claims.

BRIEF DESCRIPTION OF THE DRAWINGS

FIG. 4 is a cross-sectional view taken along the line A-A' of FIG. 2.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
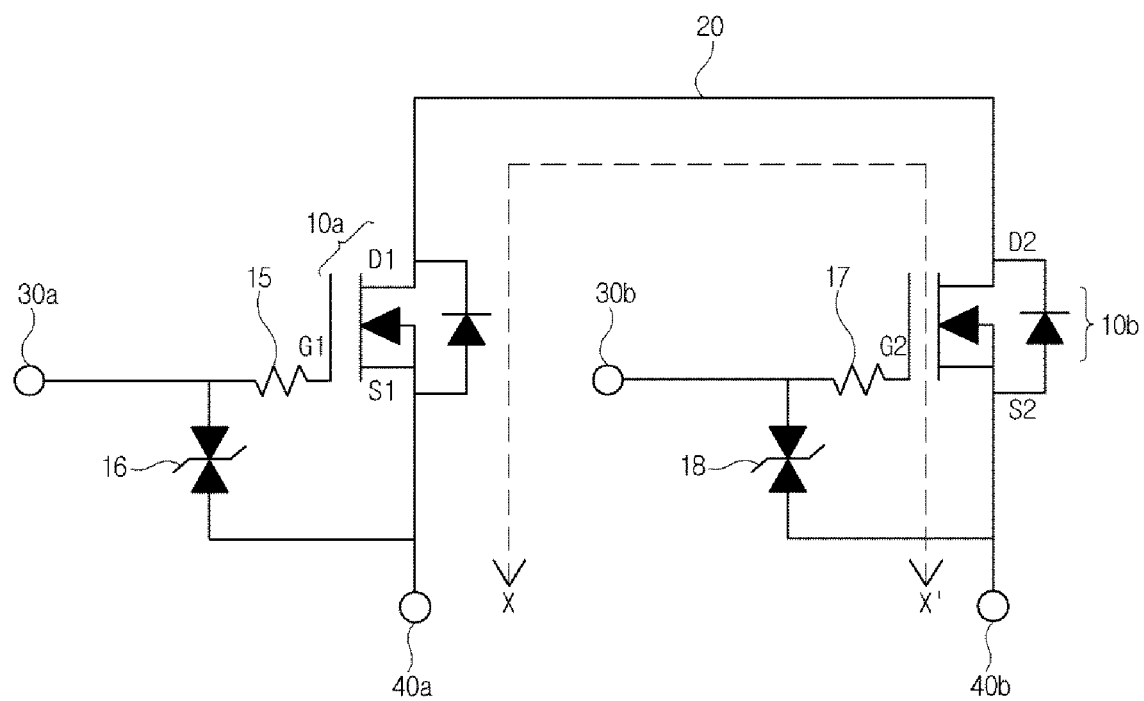
FIG. 1 is a circuit diagram illustrating a current path of a power semiconductor having dual N-channels.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Further, the examples described herein will be described with reference to cross-sectional views and/or plan views, which are ideal exemplary diagrams of the present invention. In the drawings, thicknesses of films and regions are exaggerated to effectively describe the technical contents. Therefore, the shape of an exemplary diagram may be modified by manufacturing techniques and/or tolerances. Accordingly, the examples are not limited to specific shapes shown in the drawings and include alternations in shape that is produced according to the manufacturing process. For example, etching regions shown in the drawings at a right angle may be rounded or may have a shape with a certain curvature. Thus, illustrative regions in the drawings have schematic attributes, and the shapes of the illustrative regions in the drawings are intended to illustrate specific shapes of regions of devices and not intended to limit the scope of the present examples.

An object of the examples is to provide a power semiconductor device having a structure capable of preventing reduction in breakdown voltage due to formation of a parasitic NPN transistor.

Another object of the examples is to provide a power semiconductor device having a structure in which a critical dimension (CD) between trenches is reduced such that a cell pitch of the power semiconductor device may be reduced.

Other objects and advantages of the examples may be understood by considering the following description and is apparent with reference to the examples. Also, it is apparent to those skilled in the art to which the examples pertain that the objectives and advantages of the examples may be realized by using the examples as presented and combinations thereof.

FIG. 1 is a circuit diagram illustrating a current path of a power semiconductor having dual n-channels.

FIG. 1 shows a circuit diagram of a power semiconductor having dual n-type channels to which a power semiconductor device according to an example is applied. In the example of FIG. 1, the power semiconductor has a structure including a first semiconductor device 10a, a second semiconductor device 10b, and a drain electrode 20 that is commonly used by the first semiconductor device 10a and the second semiconductor device 10b. The first semiconductor device 10a has a first n-type channel. Accordingly, a first source metal S1, a first drain electrode D1, and a first gate electrode G1 are provided at the first semiconductor device 10a. Similarly, the second semiconductor device 10b has a second n-type channel, and a second source metal S2, a second drain electrode D2, and a second gate electrode G2 are provided at the second semiconductor device 10b. The first source metal S1 of the first semiconductor device 10a is electrically separated from the second source metal S2 of the second semiconductor device 10b. By contrast, the first drain electrode D1 and the second drain electrode D2 are electrically connected to each other through the common drain electrode 20. In the example of FIG. 1, a semiconductor used as a power semiconductor device or a power management semiconductor integrated circuit (PMIC) is employed as the first semiconductor device 10a and the second semiconductor device 10b. For example, a vertical type trench metal oxide semiconductor field effect transistor (MOSFET) device or an insulated gate bipolar transistor (IGBT) device is possibly used as the first semiconductor device 10a and the second semiconductor device 10b. Alternatively, a power complementary metal-oxide semiconductor (CMOS) device or a power laterally diffused metal oxide semiconductor (LDMOS) device is possibly used as the first semiconductor device 10a and the second semiconductor device 10b.

A factor to be considered when choosing the semiconductor device is that low resistance is required for the successful operation of the semiconductor device. Because the first semiconductor device 10a and the second semiconductor device 10b are connected to each other, it is important to lower the resistance of the common drain electrode 20. Thus, in an example, resistance between the first source metal S1 and the second source metal S2 is configured to attain a value of 10 mΩ or less when the first semiconductor device 10a and the second semiconductor device 10b are in a switching ON state.

A dotted arrow (X↔'), as shown in the example of FIG. 1, corresponds to a current path when the power semiconductor is in a turn on state. When the first semiconductor device 10a and the second semiconductor device 10b are turned on, a current path is formed in a direction via the first source metal S1 of the first semiconductor device 10a, the first drain electrode D1 of the first semiconductor device 10a, the common drain electrode 20, the second drain electrode D2 of the second semiconductor device 10b, and the second source metal S2 of the second semiconductor device 10b. The current path is also formed in an opposite direction, as necessary. That is, a current flow occurs in a direction via the second source metal S2 of the second semiconductor device 10b, the second drain electrode D2 of the second semiconductor device 10b, the common drain electrode 20, the first drain electrode D1 of the first semiconductor device 10a, and the first source metal S1 of the first semiconductor device 10a. As described above, there is an advantage in such an example that the current flow may occur in both directions. A power MOSFET device or a power semiconductor, which includes such dual n-channels, has an advantage of extending a battery life of small-sized equipment. Therefore, in the example of FIG. 1, the current flow always passes through the common drain electrode 20 having a longest path in the current path. Consequently, it is important to lower the resistance of the common drain electrode 20. As a result, the resistance between the first source metal S1 and the second source metal S2 is formed to achieve a value of 10 mΩ or less, and furthermore, a value of 5 mΩ or less in an example in which the first semiconductor device 10a and the second semiconductor device 10b are in the switching on state.

Furthermore, Zener diodes 16 and 18 are respectively formed between a gate input terminal 30a and a source input terminal 40a, and between a gate input terminal 30b and a source input terminal 40b. The Zener diode 16 or 18 are each similar to other examples of a Zener diode, and are employed in a semiconductor device designed to protect electronic equipment that is sensitive to a transient high voltage. That is, each Zener diode 16 or 18 is an element that is used to protect a circuit that is easily affected by a transient electrical state generated by an electrostatic discharge (ESD), an inductive load switching, or an induced lightning discharge. When such a stress such as an ESD or a similar stress flows into the gate input terminals 30a and 30b, the Zener diodes 16 and 18 pass a current in a direction from the gate input terminals 30a and 30b towards the source input terminals 40a and 40b. A Zener diode has a PN junction structure similar to a structure of a general diode, but has a very low and constant breakdown voltage characteristic, such that a current flows when a breakdown voltage having a value that is equal to or greater than a predetermined value is applied to the Zener diode in a reverse direction. The Zener diode uses a Zener breakdown and an electron avalanche breakdown phenomena, where the Zener breakdown is a main characteristic of what occurs at 5.6V or less, and the electron avalanche breakdown is a main characteristic of what occurs at 5.6V or more. Therefore, the Zener diode is used to protect a circuit element from an overvoltage. That is, when an ESD stress of a high voltage or a high current flows in, the Zener diode is necessary to protect the relevant circuit element. Thus, in the example of FIG. 1, the Zener diodes 16 and 18 are used to protect the first and second gate electrodes G1 and G2. Furthermore, in the example of FIG. 1, resistors 15 and 17 are also disposed between the gate input terminal 30a and the first gate electrode G1, and between the gate input terminal 30b and the second gate electrode G2, respectively. Such a placement of resistors 15 and 17 is made in order to protect the first and second gate electrodes G1 and G2 from an inflow of a stress current such as an ESD or a similar current to the gate input terminals 30a and 30b. That is, the ESD stress is prevented from flowing into the first and second gate electrodes G1 and G2 by increasing resistance at a front stage of each of the first and second gate electrodes G1 and G2. In a specific example, the resistors 15 and 17 are respectively formed of non-silicide polysilicon so as to increase resistance of the resistors 15 and 17.

Figure 2:
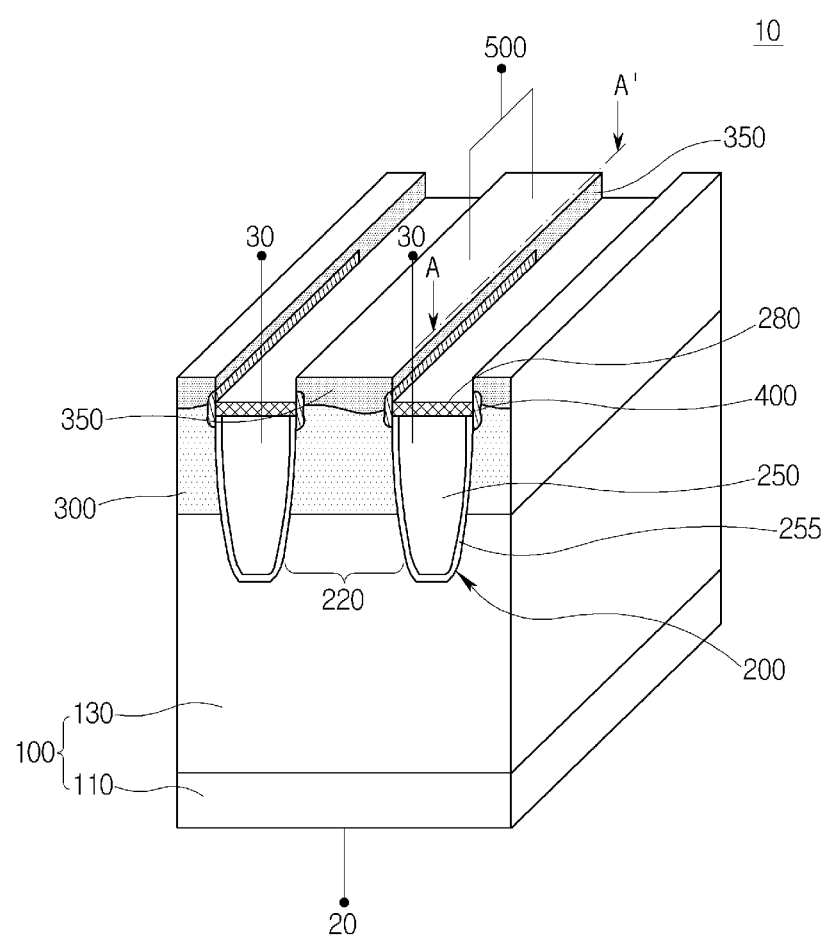
FIG. 2 is a perspective view illustrating a power semiconductor device according to an example.

FIG. 2 is a perspective view illustrating a power semiconductor device according to an example.

Referring to the example of FIG. 2, the power semiconductor device 10 includes a semiconductor substrate 100, a trench 200, a gate electrode 250, a first conductivity type body region 300, a first conductivity type highly doped body contact region 350, a second conductivity type source region 400, and an interlayer insulation film 280.

In the example of FIG. 2, the semiconductor substrate 100 is, for example, an epi-layer or a silicon substrate. The semiconductor substrate 100 includes a second conductivity type drain region 110 and a drift region 130. For example, the second conductivity type drain region 110 is a region doped with an n-type impurity. The second conductivity type drain region 110 is provided on the semiconductor substrate 100. Also, the second conductivity type drain region 110 is connected to the common drain electrode 20.

Furthermore, the drift region 130 is provided over the semiconductor substrate 100. The drift region 130 is provided on the second conductivity type drain region 110. The drift region 130 may be a second conductivity type drift region. For example, the second conductivity type may be an n-type. In such an example, the drift region 130 is an epi-layer which is epitaxially deposited. Such a process deposits a crystalline overlayer on a crystalline substrate. In order to withstand a high voltage, the drift region 130 is, for example, an epi-layer doped with a concentration lower than that of the second conductivity type drain region 110. The drift region 130 is configured to improve a breakdown voltage of the power semiconductor device 10. Thus, the drift region 130 doped with a low concentration improves breakdown voltage performance based on the principle that a breakdown voltage increases when a doping concentration of an impurity is lowered at a PN junction. Accordingly, a thickness of the drift region 130 and a doping concentration of an impurity of the drift region 130 are determined according to specifications requirements for the power semiconductor device 10.

In the example of FIG. 2, the trench 200 is provided in the drift region 130. A plurality of trenches 200 is provided to form a trench MOSFET structure. In such an example, a mesa region is defined, each between the trenches 200. For example, the mesa region is an active region.

The gate electrode 250 is provided in an interior of each of the plurality of trenches 200. For example, the gate electrode 250 is made of polysilicon (poly-Si). Also, the gate electrode 250 is connected to a gate pad 30. In terms of a circuit, the gate pad 30 corresponds to each of the first and second gate electrodes G1 and G2, as shown in the example of FIG. 1. A gate insulation film 255 is provided between an inner wall of the trench 200 and the gate electrode 250. In examples, the gate insulation film 255 is made of a material such as silicon oxide ($SiO_2$), silicon nitride (SiN), or a similar insulating material. An interlayer insulation film 280 is provided on a top surface of the gate electrode 250. The interlayer insulation film 280 serves to electrically insulate a source metal 40, which is described further, below, from the gate electrode 250. Likewise, the interlayer insulation film 280 is made of a material such as silicon oxide ($SiO_2$), silicon nitride (SiN), or a similar insulating material.

In the example of FIG. 2, the first conductivity type body region 300 is provided over the semiconductor substrate 100. The first conductivity type body region 300 is also provided on the drift region 130. For example, the first conductivity type is a p-type. Accordingly, the first conductivity type body region 300 is, for example, a first conductivity type channel region doped with a low concentration of a first conductivity type impurity.

For example, the first conductivity type highly doped body contact region 350 is provided on the first conductivity type body region 300. In such an example, the first conductivity type highly doped body contact region 350 is in contact with an upper portion of a side surface of the trench 200. For example, the first conductivity type highly doped body contact region 350 is a region doped with a concentration higher than the dopant concentration of the first conductivity type body region 300. In one example, the first conductivity type highly doped body contact region 350 is a p+body region, and the first conductivity type body region 300 is, accordingly, a p−body region. In such an example, the first conductivity type highly doped body contact region 350 is exposed through the mesa region and is in contact with the second conductivity type source region 400. Also, in an example, only the first conductivity type highly doped body contact region 350 is exposed through the mesa region. That is, the first conductivity type highly doped body contact region 350 is filled up to an upper region and a corner region of the mesa region. Thus, a distributed area of the first conductivity type highly doped body contact region 350 is varied according to a doping concentration of a p-type impurity and a corresponding processing method. Likewise, the first conductivity type highly doped body contact region 350 is electrically connected to the source metal 40. In such an example, the first conductivity type body region 300 and the first conductivity type highly doped body contact region 350 are referred to together as being a first conductivity type body region.

In the example of FIG. 2, the second conductivity type source region 400 is provided at the side surface of the trench 200. For example, the second conductivity type source region 400 is in contact with the upper portion of the side surface of the trench 200. Also, for example, the second conductivity type source region 400 is provided at the side surface of the trench 200 to extend in a depth direction into which the trench 200 extends. Because the second conductivity type source region 400 extends into the depth direction of the trench 200, a channel length that is a distance between a source and a drain is accordingly reduced. Due to the reduction of the channel length, on-resistance ($R_{Dson}$) is therefore decreased. In such an example, the second conductivity type source region 400 is in contact with the gate insulation film 255 and the interlayer insulation film 280, which are provided inside the trench 200. Also, in such an example, an uppermost portion of the second conductivity type source region 400 has a height level higher than that of an uppermost portion of the interlayer insulation film 280. Accordingly, a portion of the second conductivity type source region 400 is exposed through the trench 200. Furthermore, in such an example, the source metal 40 is provided on the interlayer insulation film 280, and the second conductivity type source region 400 is in contact with the source metal 40, of which a portion is disposed inside the trench 200.

The power semiconductor device 10 according to the examples operates as an n-channel trench MOSFET. When a positive (+) voltage is applied to the gate pad 30 of the gate electrode 250 during a turn-on operation, electrons accumulate on the side surface of the trench 200. As a result, a channel that is an inversion layer for the electrons is formed inside the first conductivity type body region 300. At this point in time, when a negative (−) voltage is applied to the source metal 40 and a positive (+) voltage is applied to the common drain electrode 20 by an operating voltage, electrons implanted via the source metal 40 thus pass through the second conductivity type source region 400. The electrons reach the drift region 130 via the channel formed in the first conductivity type body region 300, and then flow into the second conductivity type drain region 110 and the common drain electrode 20.

When the negative (−) voltage is applied to the gate pad 30 of the gate electrode 250 during a turn-off operation, the inverted channel disappears as a result. At this point in time, the current flowing between the source metal 40 and the common drain electrode 20 is blocked by the presence of the electrons, and thus the power semiconductor device 10 does not further operate.

According to the examples, because an area in which the second conductivity type source regions 400 are distributed is limited to the side surface of the trench 200, a structure in which the second conductivity type source regions 400 are separated from each other is possibly formed. Consequently, most of the mesa region is therefore occupied by the first conductivity type highly doped body contact region 350 and in this manner, a reduction in breakdown voltage resulting from a parasitic NPN transistor is prevented.

Furthermore, contact recess etching for allowing the source metal 40 and a first conductivity type region, as used in alternative technologies, is not necessarily used in examples to prevent the reduction in breakdown voltage resulting from the parasitic NPN transistor, such that a process may be simplified.

Furthermore, because the contact recess region is not separately formed, a CD between the trenches 200 is reduced, such that a cell pitch of the power semiconductor device 10 is also reduced. Accordingly, because more active regions are formed in the same area, the on-resistance ($R_{Dson}$) is thus decreased, such that efficiency of the power semiconductor device 10 is accordingly increased.

Furthermore, in the example of FIG. 2, the second conductivity type source region 400 is formed along the side surface of the trench 200 in the depth direction of the trench 200, such that the channel length is thus reduced. As the channel length is reduced, the on-resistance ($R_{Dson}$) is thus also reduced, such that the efficiency of the power semiconductor device 10 is increased.

Figure 3:
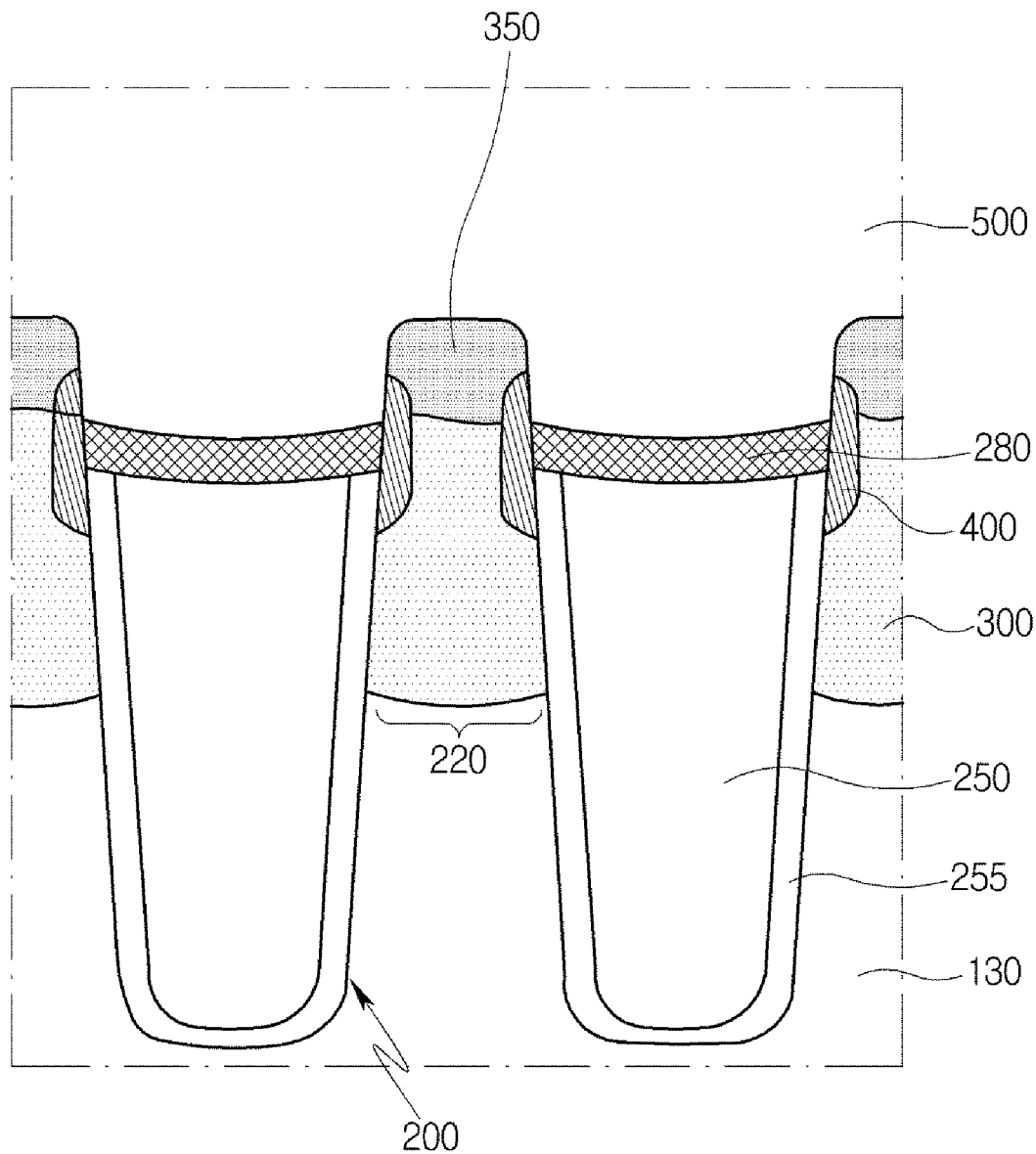
FIG. 3 is a cross-sectional view illustrating the power semiconductor device according to an example.

FIG. 3 is a cross-sectional view illustrating the power semiconductor device 10 according to example. For simplicity of description, a detailed description that merely repeats that of FIG. 2 will be omitted for brevity.

Referring to the example of FIG. 3, the first conductivity type body region 300 and the first conductivity type highly doped body contact region 350 are disposed in a mesa region 220 between the trenches 200. For example, each of the trenches 200 has a recessed shape extending in a direction from the first conductivity type body region 300 toward the drift region 130. That is, the trench 200 extends in the direction from the first conductivity type body region 300 toward the drift region 130. Also, the first conductivity type highly doped body contact region 350 is disposed on the first conductivity type body region 300. Accordingly, the first conductivity type highly doped body contact region 350 is formed to cover the second conductivity type source region 400. Furthermore, the first conductivity type highly doped body contact region 350 separates a second conductivity type source region 400 disposed on a side surface of one trench 200 from a second conductivity type source region 400 disposed on a side surface of another trench 200. Furthermore, the first conductivity type highly doped body contact region 350 is filled in an upper portion and edges of the mesa region 220, which prevents the second conductivity type source region 400 from being exposed through a top surface of the mesa region 220. Put otherwise, only the first conductivity type highly doped body contact region 350 is exposed through the mesa region 220. Consequently, most of the mesa region 220 is occupied by the first conductivity type highly doped body contact region 350, such that the reduction in breakdown voltage otherwise resulting from the parasitic NPN transistor is accordingly prevented.

In summary, because only the first conductivity type highly doped body contact region 350 is formed on the top surface of the mesa region 220, a source metal 500 is in contact only with the first conductivity type highly doped body contact region 350 through the top surface of the mesa region 220. By contrast, in such an example, the second conductivity type source region 400, the first conductivity type highly doped body contact region 350, and the source metal 500 are simultaneously in contact with each other on the side surface of the mesa region 220. Alternatively put, the second conductivity type source region 400, the first conductivity type highly doped body contact region 350, and the source metal 500, which are exposed to the side surface of the trench 200, are disposed to be in contact with each other.

In the example of FIG. 3, the source metal 500 is provided on the interlayer insulation film 280. The source metal 500 is disposed to be in contact with the side surface of the trench 200, the second conductivity type source region 400, and the first conductivity type highly doped body contact region 350. For example, the source metal 500 may be made of an alloy of titanium (Ti), titanium nitride (TiN), and aluminum (Al). However, these are only examples and other materials with appropriate properties may be used. Alternatively, the source metal 500 may be made of gold (Au), platinum (Pt), or an alloy of aluminum (Al) and silicon (Si). However, a material constituting the source metal 500 is not necessarily limited to these candidate materials.

The second conductivity type source region 400 is partially exposed through the trench 200 and is electrically connected to the source metal 500 disposed inside the trench 200. The second conductivity type source region 400 is formed and spaced apart from the top surface of the mesa region 220 by a predetermined distance and is disposed along the side surface of the trench 200. In such an example, an uppermost portion of the second conductivity type source region 400 has a height level higher than that of an uppermost portion of the interlayer insulation film 280, and a lowermost portion of the second conductivity type source region 400 is lower than an uppermost portion of the gate electrode 250. That is, in such an example, the second conductivity type source region 400 has a shape extending in the depth direction in which the trench 200 extends and is in contact with the side surface of the trench 200.

FIG. 4 is a cross-sectional view taken along the line A-A' of FIG. 2. For simplicity of description, redundant description is omitted for brevity.

Referring to the examples of FIGS. 2 and 4, the second conductivity type source region 400 and the first conductivity type highly doped body contact region 350 are formed on the first conductivity type body region 300. However, the second conductivity type source region 400 is disposed in first conductivity type layers. For example, the second conductivity type source region 400 is disposed between the first conductivity type highly doped body contact region 350 and the first conductivity type body region 300. Alternatively, the second conductivity type source region 400 is provided in the first conductivity type highly doped body contact region 350.

In such an example, the second conductivity type source region 400 is not exposed to the mesa region by the first conductivity type highly doped body contact region 350. Furthermore, because the second conductivity type source region 400 is partially present on only the side surface of the trench 200, most of the mesa region is occupied by the first conductivity type highly doped body contact region 350, such that the reduction in breakdown voltage resulting from the parasitic NPN transistor is prevented.

FIGS. 5A to 5J are diagrams illustrating a method for manufacturing a power semiconductor device according to an example.

Figure 5A:
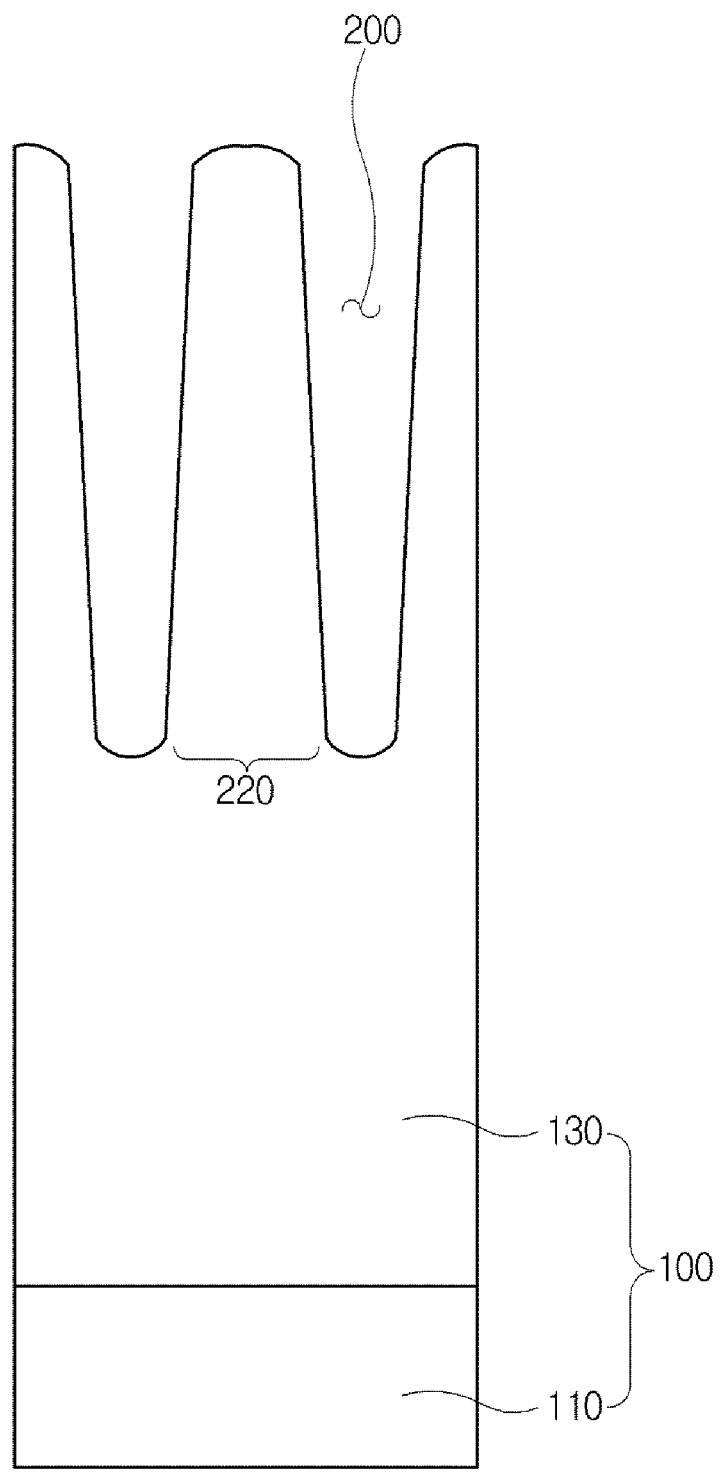
FIGS. 5A to 5J are diagrams illustrating a method for manufacturing a power semiconductor device according to an example.

Referring to the example of FIG. 5A, the drift region 130 of a second conductivity type is formed. A lightly doped epi-layer is thickly deposited on a bare substrate to form the semiconductor substrate 100, including the drift region 130. Alternatively, the semiconductor substrate 100 is formed by forming a thick, lightly doped epi-layer over a thin, heavily doped epi-layer. For example, the thin, heavily doped epi-layer is the second conductivity type drain region 110 and the thick lightly doped epi-layer is the drift region 130.

In such an example, subsequently, a plurality of trenches 200 is formed using dry etching. The trench 200 is recessed in a direction from the drift region 130 toward the second conductivity type drain region 110. At this point in time, a depth of the trench 200 is, for example, in a range of 1 μm to 5 μm. Also, when the plurality of trenches 200 are formed, the semiconductor substrate 100 is etched to maintain an inclination in a range of 85 degrees to 89 degrees. In such an example, an active region provided between the plurality of trenches 200 is defined as being the mesa region 220. The mesa region 220, described further below, is a region in which a first conductivity type highly doped body contact region and a second conductivity type source region are formed.

Figure 5B:
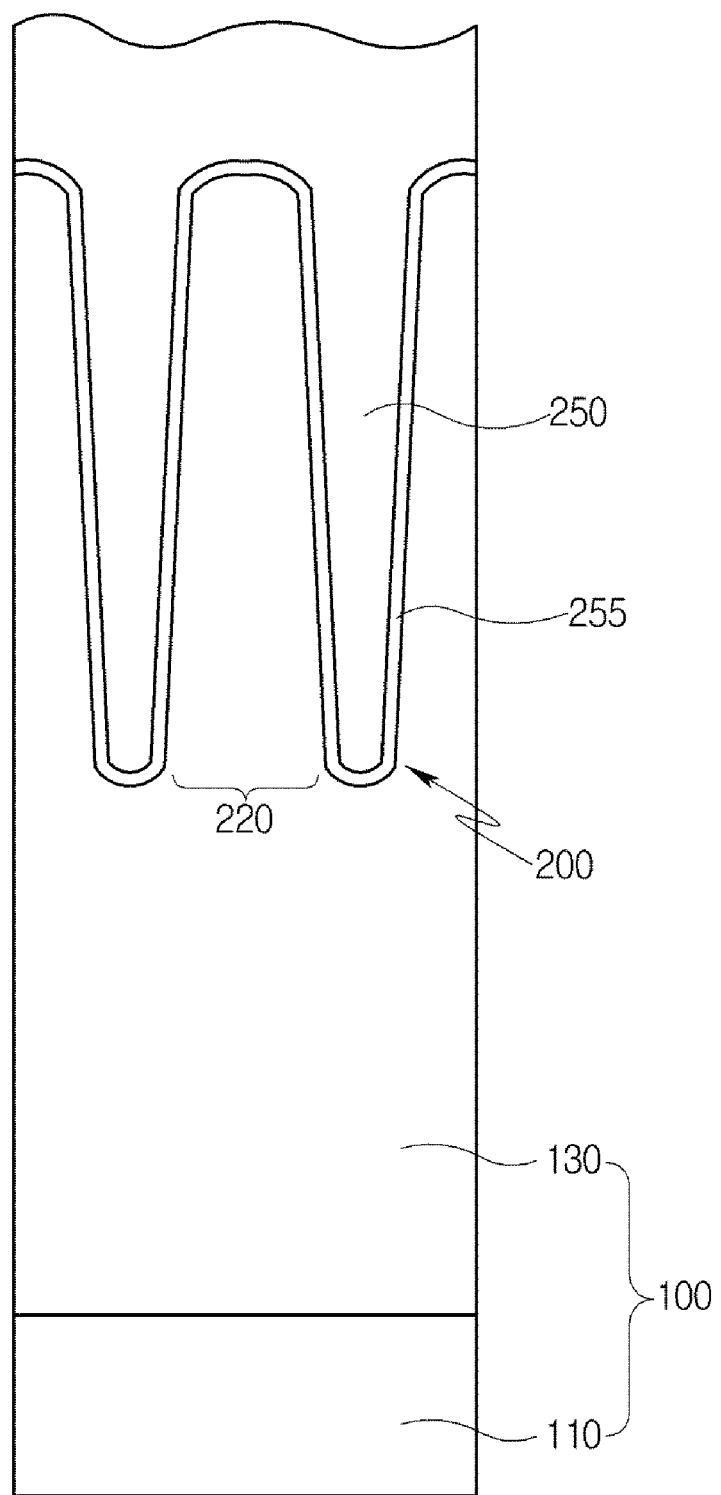

Referring to the example of FIG. 5B, the gate insulation film 255 is formed on the inner wall of the trench 200, and the gate electrode 250 is formed on the gate insulation film 255. For example, the gate insulation film 255 is formed by thermal oxidation. In order to make a threshold voltage be in a range of about 1.0 V to about 1.2 V, the gate insulation film 255 is formed to have a thickness in a range of 20 nm to 100 nm. For example, in order to form the gate electrode 250, polysilicon is used. At this point in the manufacturing process, in order to control a resistance of the gate electrode 250, doped polysilicon (doped poly-Si) or undoped polysilicon (undoped poly-Si) may be selected as ways of managing the resistance of the gate electrode.

Figure 5C:
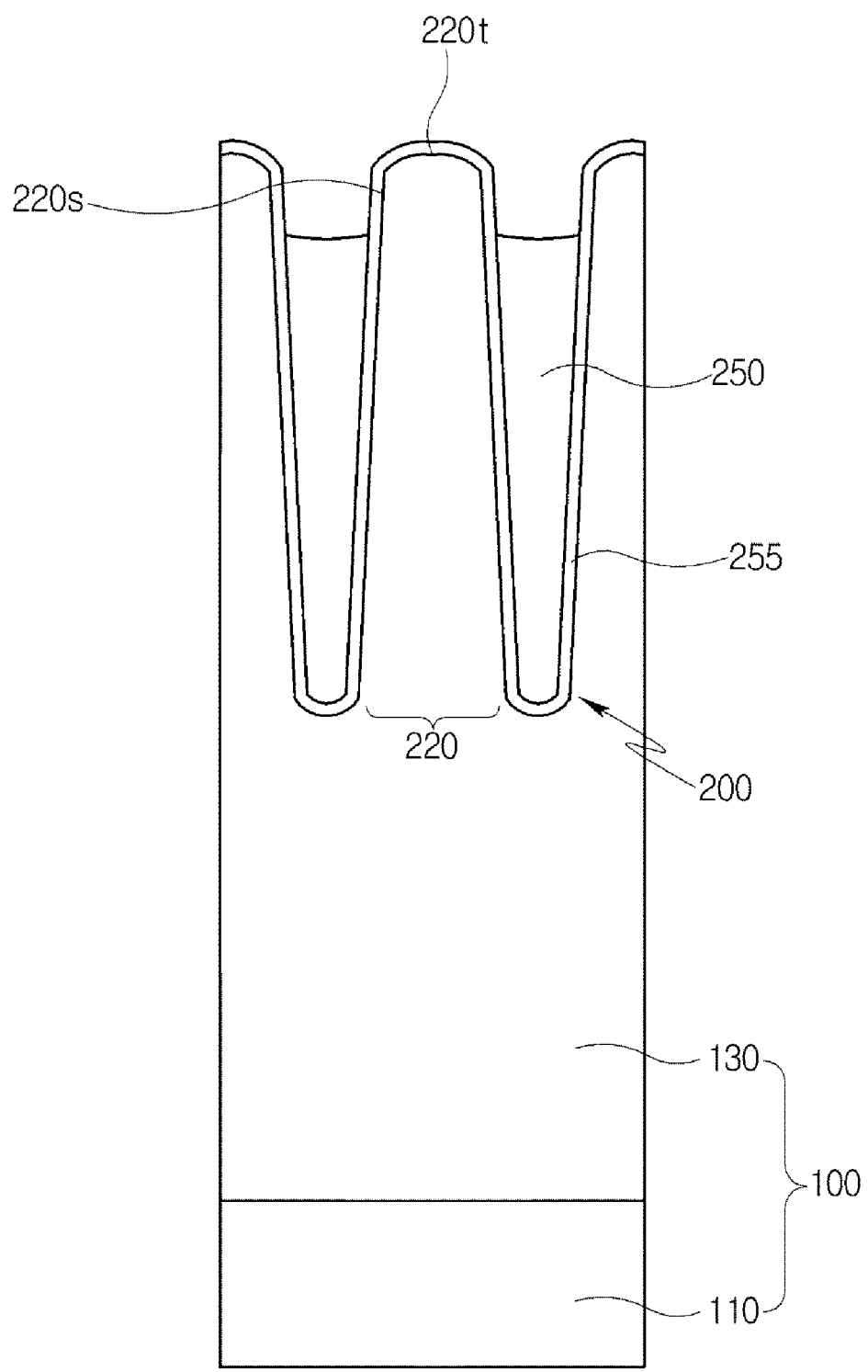

Referring to the example of FIG. 5C, the gate electrode 250 deposited up to the outside of the trench 200 is etched. In such an example, the gate electrode 250 provided outside the trench 200 is etched so as to dispose the gate electrode 250 within the trench 200. For example, a thickness of the etched gate electrode 250 is provided to be in a range of 500 nm to 1000 nm. In such an example, an upper portion of the trench 200 is not filled with the gate electrode 250. Because the gate electrode 250 is recessed into the trench 200, a top surface 220t and a side surface 220s of the mesa region 220 are exposed. For example, the top surface 220t of the mesa region 220 is exposed to the outside of the semiconductor substrate 100. A breakdown voltage, a channel depth, and an ohmic contact value are varied during the manufacturing process. Such quantities are varied according to a thickness of polysilicon constituting the gate electrode 250, such that the thickness of the gate electrode 250 is controlled in consideration of an operational characteristic of a power semiconductor device.

Figure 5D:
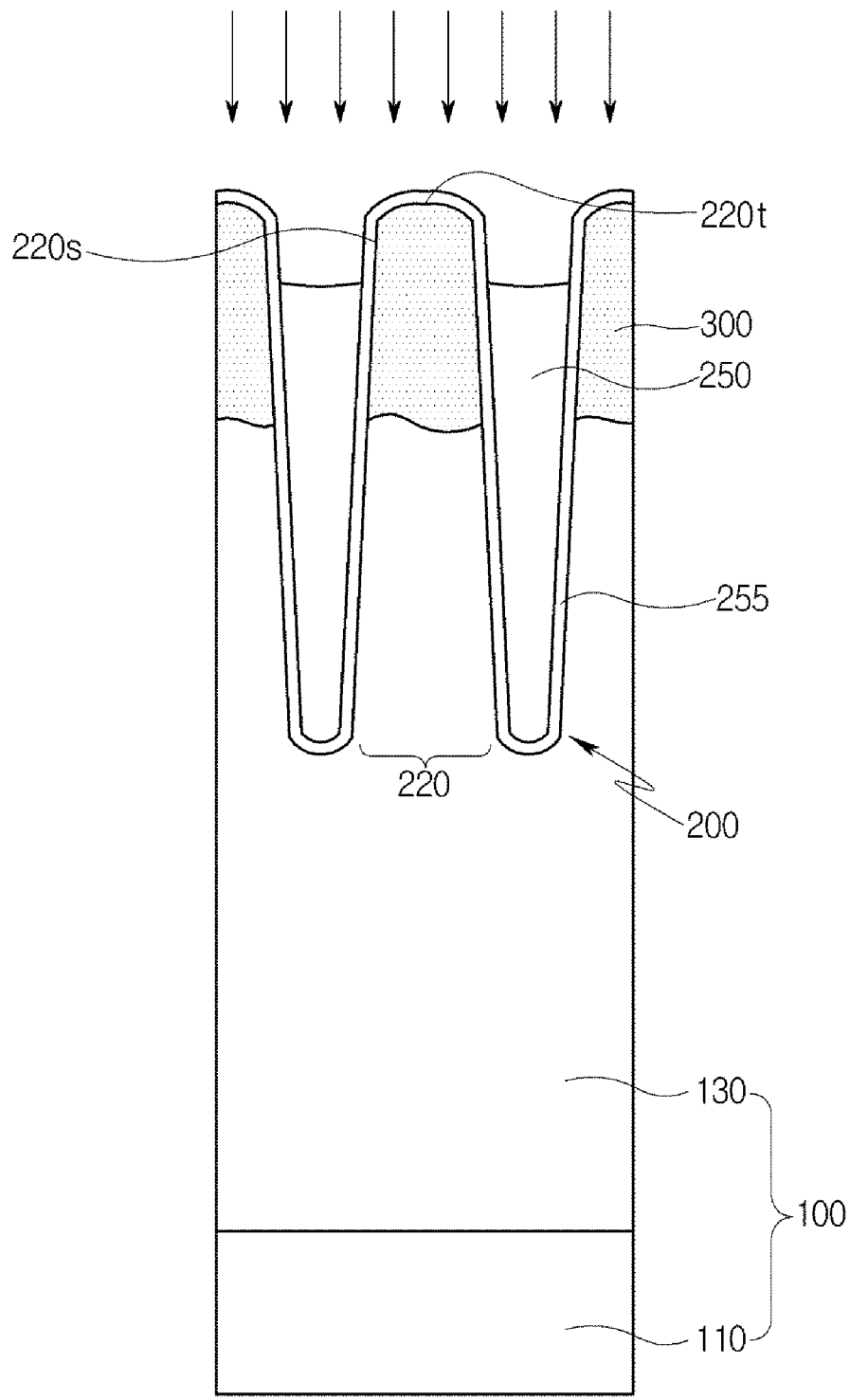

Referring to the example of FIG. 5D, implantation of a p-type impurity is performed to form the first conductivity type body region 300. A dose and energy implanted to form a lightly doped first conductivity type body region 300 is controlled to be suitable for characteristics of a threshold voltage and an on-resistance ($R_{Dson}$).

Figure 5E:
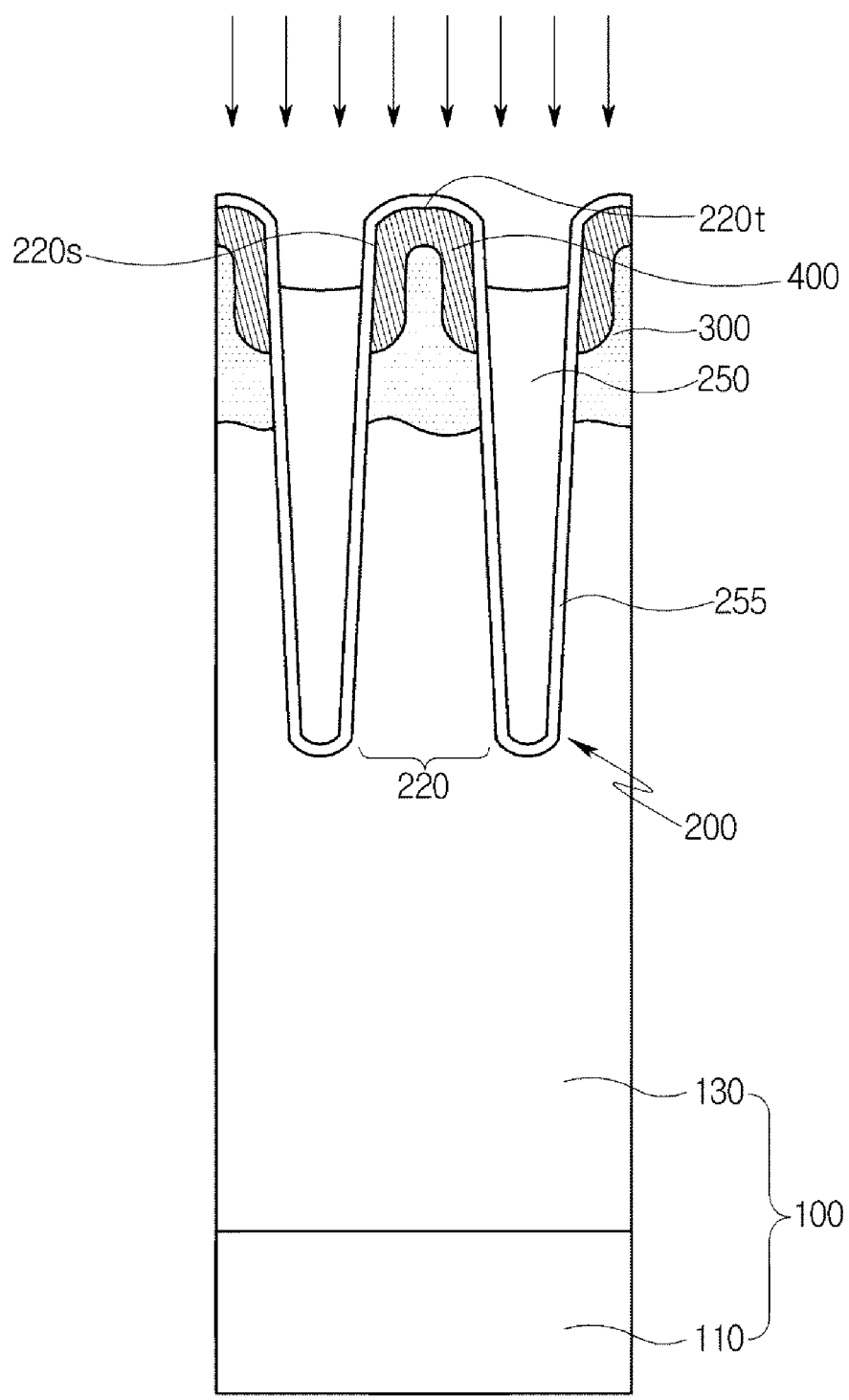

Referring to the example of FIG. 5E, implantation of a high concentration n-type impurity into an upper portion of the first conductivity type body region 300 is performed to form the second conductivity type source region 400. Accordingly, the second conductivity type source region 400 is formed to be longer along the side surface 220s of the upper portion of the mesa region 220 and the side surface of the trench 200. The second conductivity type source region 400 is formed on the top surface of the mesa region 220. Also, in such an example, the second conductivity type source region 400 has a structure extending in the depth direction of the trench 200 along the side surface of the trench 200. With the above-described structure, the long second conductivity type source region 400 is formed with respect to an interior of the first conductivity type body region 300 such that the channel length may be reduced, and the threshold voltage may be decreased. Furthermore, such a structure reduces the characteristic of on-resistance ($R_{Dson}$). In the example of FIG. 5E, an n⁺ mask pattern formed by a process such as an n⁺ photo step is used so as to form the second conductivity type source region 400. At this point, a concentration of the n-type impurity is greater than that of the p-type impurity implanted to form the first conductivity type body region 300. For example, a concentration of the n-type impurity is in a range of $1.0E14/cm^2$ to $1.0E16/cm^2$, and an ion implantation energy is in a range of 60 keV to 80 keV.

Figure 5F:
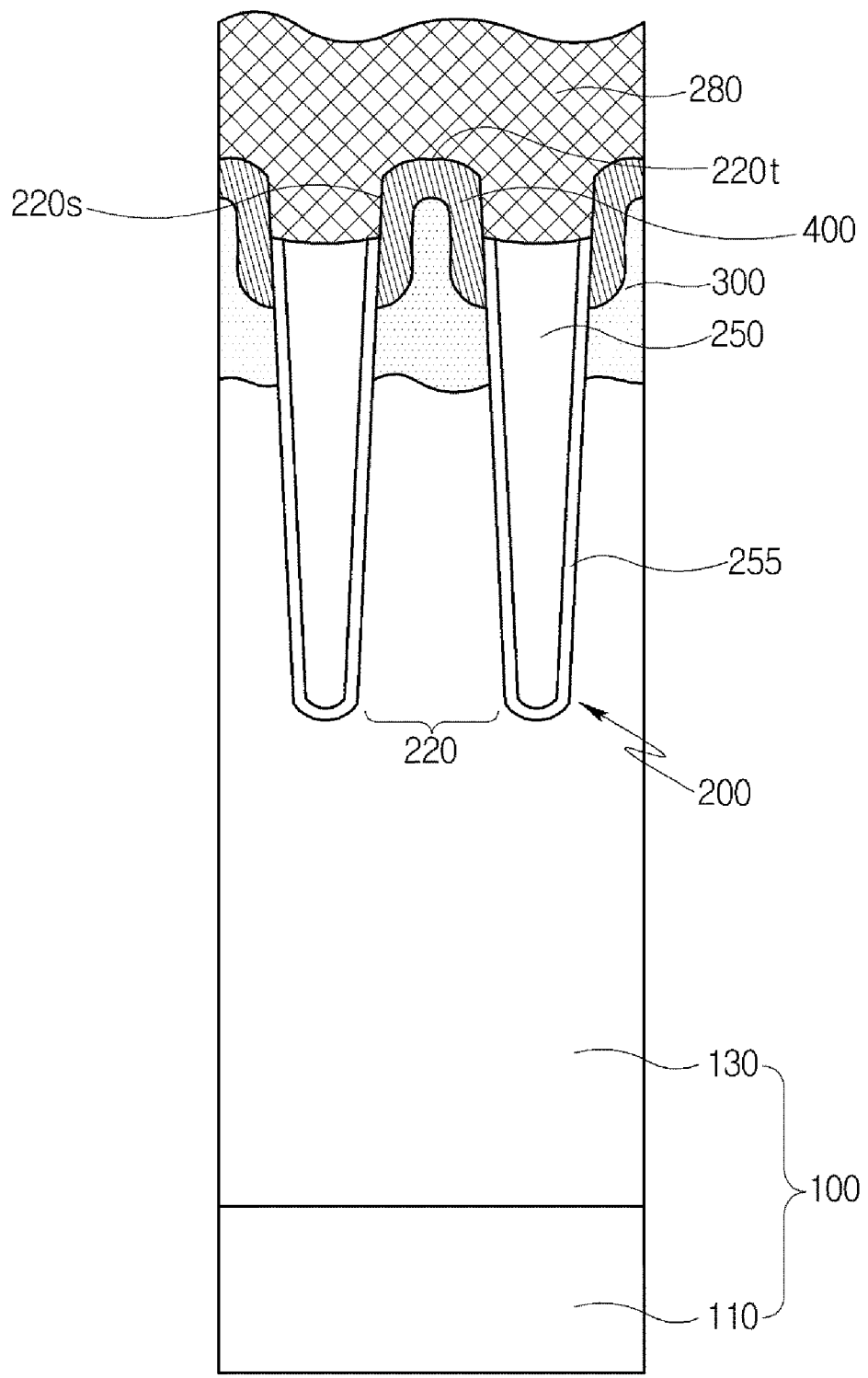

Referring to the example of FIG. 5F, the gate insulation film 255 covering a portion of the inner wall of the trench 200 and a portion of the second conductivity type source region 400 are removed. Because the gate insulation film 255 is removed, a portion of the second conductivity type source region 400 is exposed through the inner wall of the trench 200. Alternatively put, a portion of the second conductivity type source region 400 formed on the side surface 220s of the mesa region 220 is exposed during this portion of the manufacturing process.

Subsequently, the interlayer insulation film 280 is formed in an interior of the trench 200 and the second conductivity type source region 400. Accordingly, the interlayer insulation film 280 is disposed on the gate electrode 250 inside the trench 200. For example, the interlayer insulation film 280 includes a chemical vapor deposition (CVD) insulation film (HLD). In such an example, the interlayer insulation film 280 has a thickness in a range of 0.3 µm to 0.5 µm.

Figure 5G:
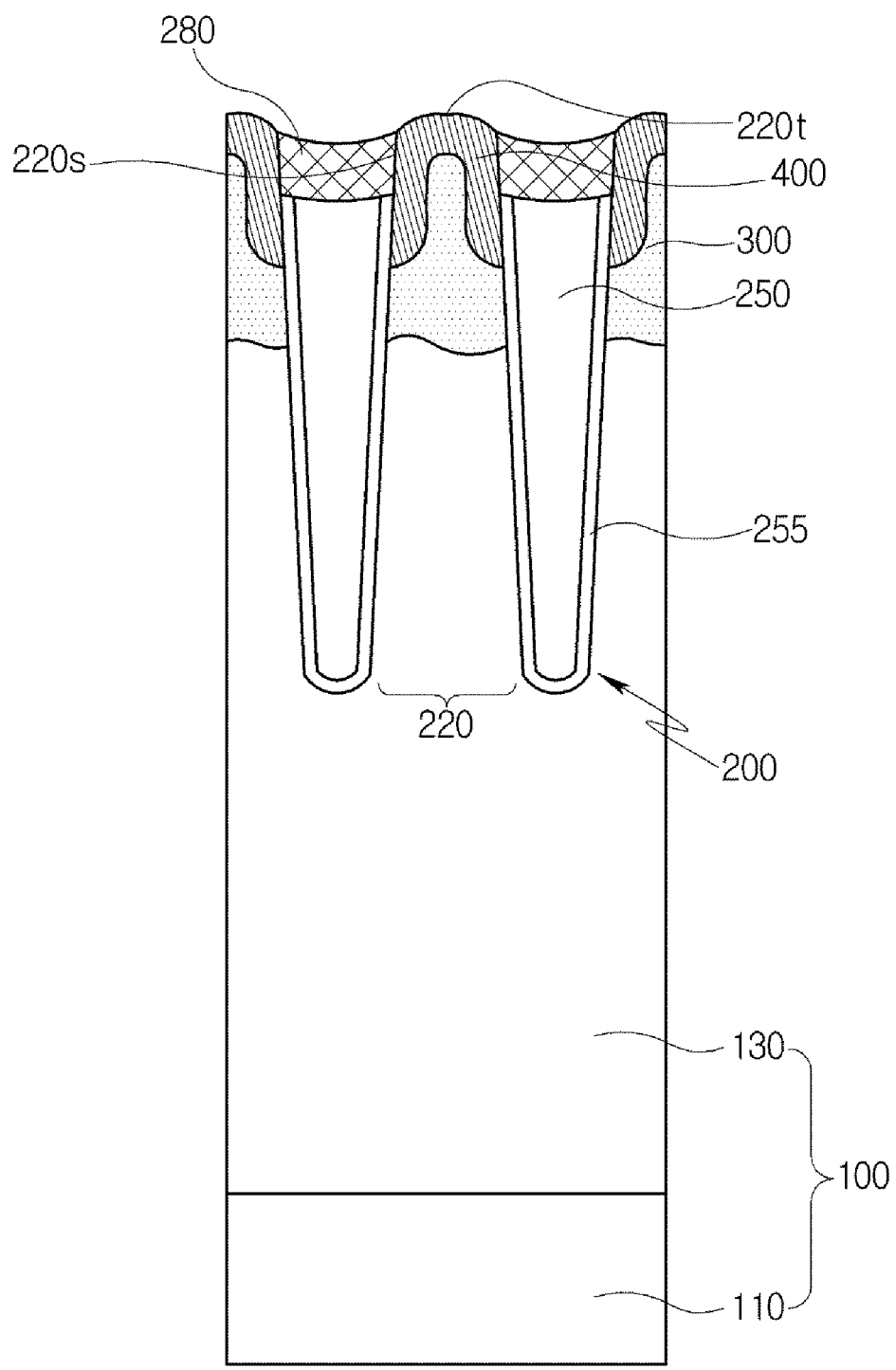

Referring to the example of FIG. 5G, a contact photo process and contact etching are performed to expose the second conductivity type source region 400. In such an example, the gate insulation film 255 covering the mesa region 220 is removed by the etching of the interlayer insulation film 280. The etching is stopped when the second conductivity type source region 400 is exposed. That is, in such an example, when the interlayer insulation film 280 is etched, an end time of the etching is potentially specified using an end point detection (EPD) technique.

Contact etching utilizes self-aligned contact (SAC) etching that does not require a mask pattern. In the contact etching, the mesa region 220 is potentially exposed, even when only first dry or wet etching is performed. Accordingly, a height of the top surface of the interlayer insulation film 280 is substantially equal to that of the top surface 220t of the mesa region 220.

Figure 5H:
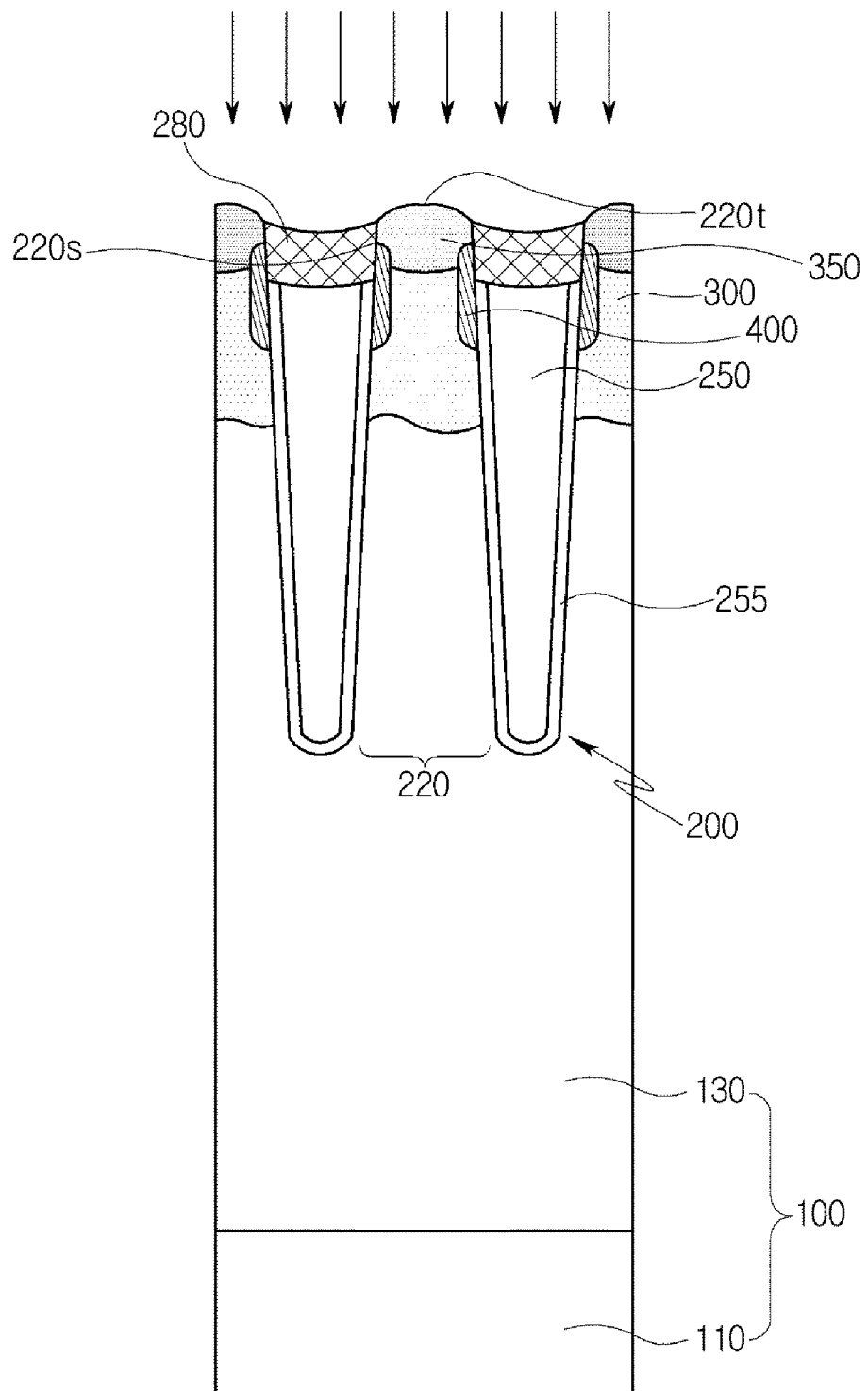

Referring to the example of FIG. 5H, a p-type impurity is implanted to form the first conductivity type highly doped body contact region 350. For example, the p-type impurity is implanted such that the second conductivity type source region 400 is completely counter-doped. In such an example, a concentration of the p-type impurity is higher than that of the n-type impurity implanted to form the second conductivity type source region 400. For example, a concentration of the p-type impurity is in a range of $3.0E15/cm^2$ to $1.0E16/cm^2$, and doping energy is in a range of 40 keV to 60 keV. As counter-doping is performed with respect to the p-type impurity, the second conductivity type source region 400 is separated by a first conductivity type highly doped body contact region 350. That is, the second conductivity type source region 400 partially remains on only the side surface of the trench 200. Accordingly, a structure is formed such that the first conductivity type highly doped body contact region 350 is exposed through the area of mesa region 220, but the second conductivity type source region 400 is not exposed in the area of mesa region 220.

Subsequently, in an example, annealing is performed to activate the n-type impurity and the p-type impurity.

Figure 5I:
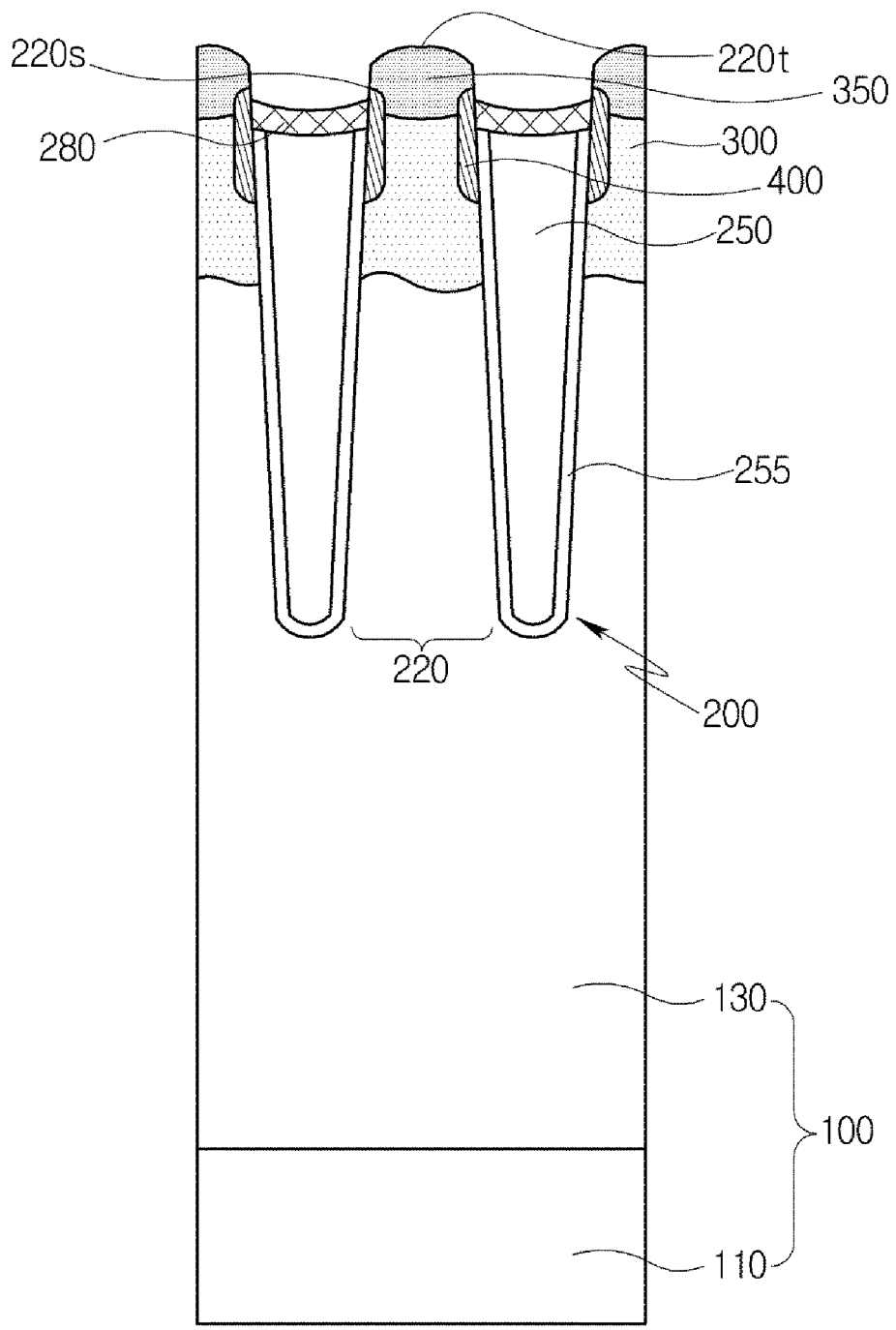

Referring to the example of FIG. 5I, etching the interlayer insulation film 280 is performed to form the source metal 500 in contact with the second conductivity type source region 400 and the first conductivity type highly doped body contact region 350. Accordingly, a portion of the second conductivity type source region 400 is exposed through the trench 200. Likewise, the etching of the interlayer insulation film 280 is performed using plasma blanket etching without a separate mask. Accordingly, the interlayer insulation film 280 is recessed into the depth direction of the trench 200. In the example of FIG. 5I, a height level of the uppermost portion of the interlayer insulation film 280 is lower than a height level of the top surface of the mesa region 220 formed by etching the interlayer insulation film 280. Consequently, the uppermost portion of the second conductivity type source region 400 has a height level that is higher than the height level of the uppermost portion of the interlayer insulation film 280. As a result of this height relationship, a contact hole or a contact trench is not formed in the mesa region 220.

Figure 5J:
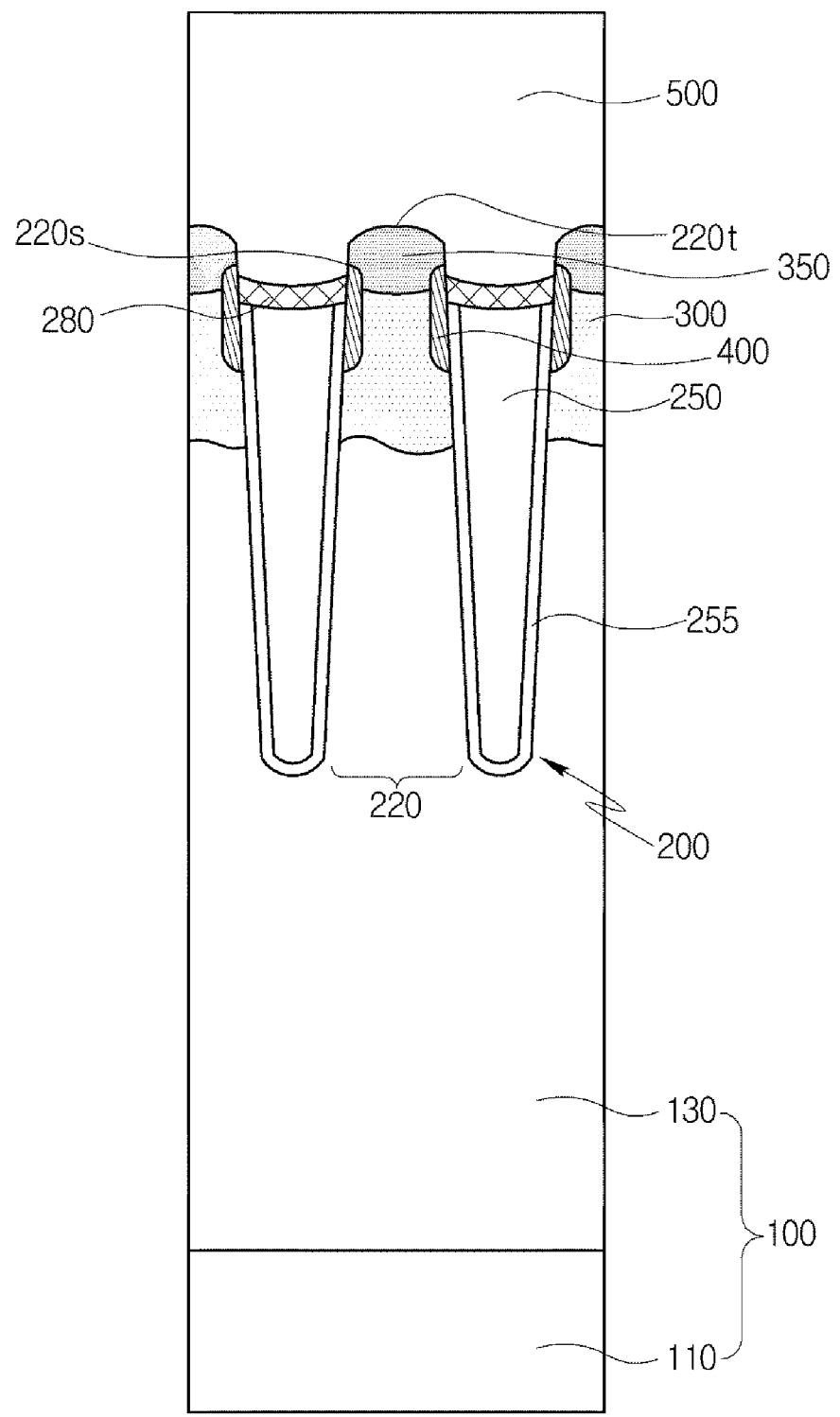

Referring to the example of FIG. 5J, the source metal 500 is formed and is electrically connected to the first conductivity type highly doped body contact region 350 and the second conductivity type source region 400. In such an example, the source metal 500 is in contact with the side surface of the trench 200. Furthermore, the second conductivity type source region 400, the first conductivity type highly doped body contact region 350, and the source metal 500, which are exposed through the side surface 220s of the trench 200, are formed to be in contact with each other. Because only the first conductivity type highly doped body contact region 350 is formed on the top surface 220t of the mesa region 220, the source metal 500 and the first conductivity type highly doped body contact region 350 are in contact with each other along the top surface 220t of the mesa region 220. Alternatively put, only the first conductivity type highly doped body contact region 350 is exposed to the outside along the top surface 220t of the mesa region 220. On the other hand, the second conductivity type source region 400, the first conductivity type highly doped body contact region 350, and the source metal 500 are simultaneously in contact with each other on the side surface 220s of the mesa region 220. For example, an alloy made of titanium (Ti), titanium nitride (TiN), and aluminum (Al) is deposited to form the source metal 500. However, a material constituting the source metal 500 is not to be limited to these materials, and other appropriate metals may be used as the source metal 500.

Furthermore, a protective film is optionally formed to improve defective and problematic phenomena such as a soft breakdown voltage and to prevent water infiltration. For example, the protective film is formed in a structure covering the source metal 500. The protective film potentially has a structure in which a tetraethoxysilane (TEOS) film, which is one variety of oxide film, and a silicon nitride (SiN) film are sequentially deposited. However, other structures and materials may be used to provide the protective film.

According to the examples, separate etching is not needed to allow the source metal 500 and the first conductivity type highly doped body contact region 350 to be in contact with each other along the mesa region 220 between the trenches 200. Accordingly, the process of manufacturing the power semiconductor device 10 is thereby simplified.

Furthermore, the power semiconductor device 10 according to the examples allows the second conductivity type source region 400 and the source metal 500 to be in contact with each other along the trench 200 and allows the first conductivity type highly doped body contact region 350 and the source metal 500 to be in contact with each other along the mesa region 220. Therefore, a separate recessed region for allowing the source metal 500 and the first conductivity type highly doped body contact region 350 to be in contact with each other is not required in the mesa region 220. As a result, a contact hole or a contact trench is not formed in the mesa region 220. Therefore, the cell pitch that is a distance between the trenches 200 is reduced and a larger quantity of active regions is formed in the same area, such that the on-resistance ($R_{Dson}$) is decreased and the efficiency of the power semiconductor device 10 is increased.

Figure 6:
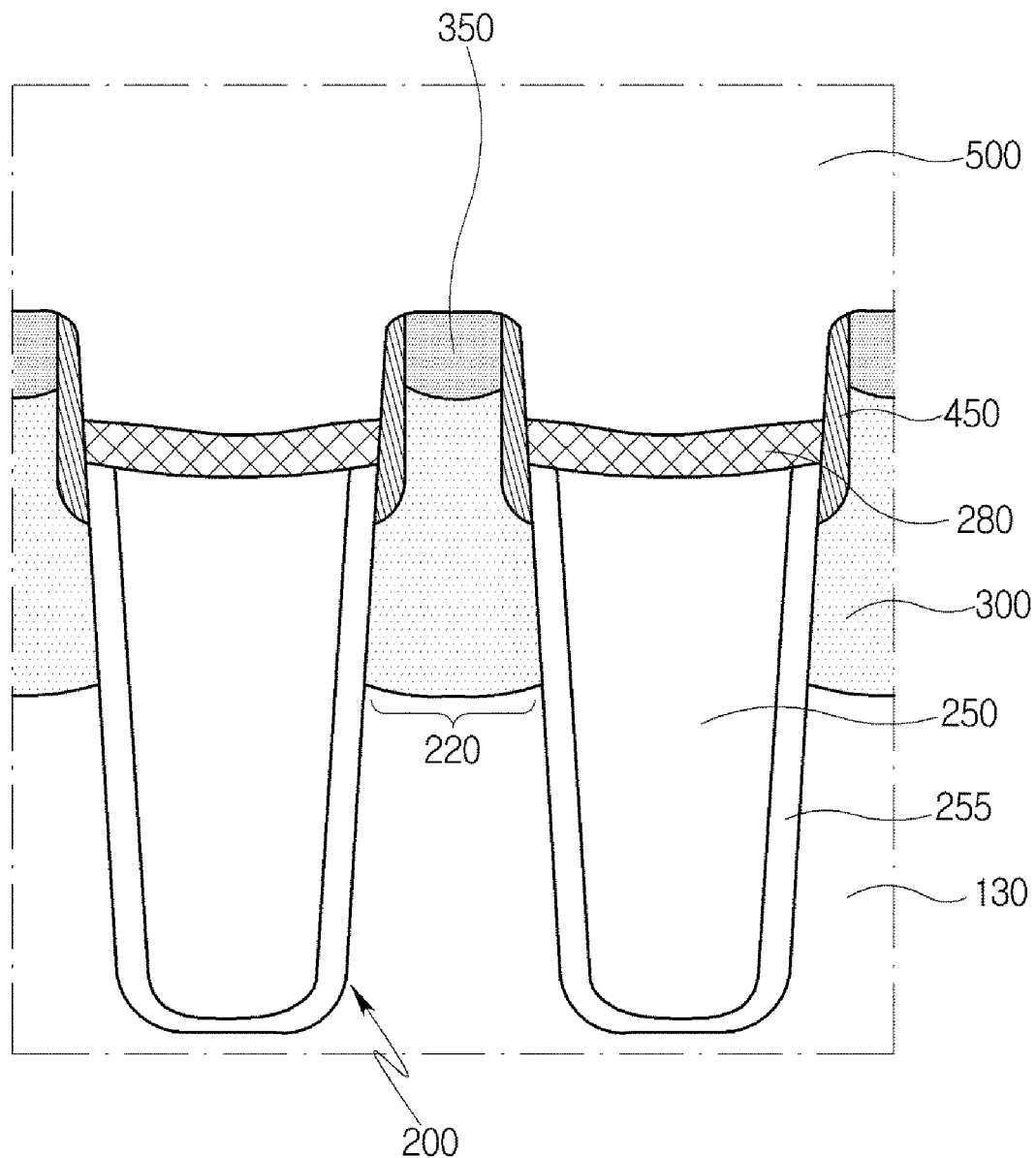
FIG. 6 is a cross-sectional view illustrating a power semiconductor device according to another example.

FIG. 6 is a cross-sectional view illustrating a power semiconductor device according to another example. For simplicity of description, a detailed description redundant with that of FIG. 2 will be omitted for brevity.

Referring to the example of FIG. 6, a second conductivity type source region 450 has a shape extending into the depth direction of the trench 200 along the side surface of the trench 200. A portion of the second conductivity type source region 450 is exposed along the mesa region 220, which is a space between the trenches 200. Therefore, a structure in which the second conductivity type source region 450 and the source metal 500 are in direct contact with each other through the mesa region 220 is implemented. In the example of FIG. 6, an uppermost portion of the second conductivity type source region 450 has a height level substantially equal to that of an uppermost portion of the first conductivity type highly doped body contact region 350. Furthermore, the uppermost portion of the second conductivity type source region 450 has a height level higher than a height level of the uppermost portion of the interlayer insulation film 280.

According to the examples, the second conductivity type source region 450 is in contact with the source metal 500 along the trench 200 and is in contact with the source metal 500 along the mesa region 220. Thus, an electrical connection between the second conductivity type source region 450 and the source metal 500 is easily implemented. Furthermore, most of a space of the mesa region 220 is filled with the first conductivity type highly doped body contact region 350, such that a reduction in breakdown voltage resulting from the presence of a parasitic NPN transistor is prevented.

According to the examples, because an area in which second conductivity type source regions are distributed is limited to a side surface of a trench, it is possible to form a structure in which the second conductivity type source regions are separated from each other. Consequently, most of a mesa region is occupied by a first conductivity type highly doped body contact region, such that the reduction in breakdown voltage resulting from the parasitic NPN transistor is prevented.

Furthermore, contact recess etching used for allowing a source metal and a first conductivity type region to be in direct contact with each other may not be required to prevent the reduction in breakdown voltage resulting from the parasitic NPN transistor. Accordingly, a manufacturing process is simplified.

Furthermore, because a contact recess region is not separately formed, it is possible to reduce a CD between the trenches such that a cell pitch of the power semiconductor device is reduced. Accordingly, since a larger amount of active regions can be formed in the same area, on-resistance ($R_{Dson}$) is decreased such that efficiency of the power semiconductor device is increased.

Furthermore, it is possible to form the second conductivity type source region in a depth direction of the trench along the side surface of the trench, such that a channel length is reduced. As the channel length is reduced, the on-resistance ($R_{Dson}$) is decreased such that the efficiency of the power semiconductor device is increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device, comprising:
   a semiconductor substrate;
   trenches formed in the semiconductor substrate;
   a mesa region defined between each of the trenches;
   a gate insulation film provided on an inner wall of each of the trenches;
   a gate electrode provided on the gate insulation film;
   a first conductivity type highly doped body contact region provided at an upper portion of the mesa region;
   a second conductivity type source region spaced apart from a top surface of the mesa region by a predetermined distance and disposed along a side surface of each of the trenches;
   a first conductivity type body region provided to be in contact with the first conductivity type highly doped body contact region and the second conductivity type source region; and
   a source metal provided to be in contact with a side surface of the mesa region, the second conductivity type source region, and the first conductivity type highly doped body contact region.

2. The device of claim 1, wherein the first conductivity type highly doped body contact region and the second conductivity type source region are in contact with the side surface of each of the trenches.

3. The device of claim 1, further comprising:
   an interlayer insulation film provided at an interior of each of the trenches.

4. The device of claim 3, wherein the source metal is in contact with the interlayer insulation film.

5. The device of claim 3, wherein a height level of an uppermost portion of the interlayer insulation film is lower than that of an uppermost portion of the second conductivity type source region.

6. The device of claim 1, wherein the second conductivity type source region is provided to extend into a depth direction of each of the trenches, along the side surface of each of the trenches.

7. The device of claim 1, wherein only the first conductivity type highly doped body contact region is exposed through the top surface of the mesa region.

8. The device of claim 1, wherein the second conductivity type source region provided at one trench among the trenches is spaced apart from the second conductivity type source region provided at a trench adjacent to the one trench.

9. The device of claim 1, wherein the gate electrode is connected to a gate pad.

10. A power semiconductor device comprising:
    trenches formed in a semiconductor substrate;
    a mesa region defined between each of the trenches;
    a gate electrode disposed on a gate insulation film formed on an inner wall of each of the trenches;
    a P-type highly doped body contact region provided at an upper portion of a P-type body region formed in the mesa region;
    an N-type source region formed along a side surface of each of the trenches and spaced apart from each other; and a source metal formed on a side surface of the N-type source region and side and upper surfaces of the highly doped body contact region, wherein the P-type highly doped body contact region formed between two adjacent trenches separates the N-type source region disposed on a side surface of one trench from the N-type source region disposed on a side surface of another trench.

11. The device of claim 10, wherein the semiconductor substrate is a silicon substrate or an epi-layer, and comprises an N-type drain region connected to a common drain electrode.

12. The device of claim 10, further comprising an interlayer insulation film provided at an interior of each of the trenches.

13. The device of claim 10, wherein the P-type highly doped body contact region is formed to cover the N-type source region to prevent the N-type source region from being exposed through a top surface of the mesa region.

14. The device of claim 12, wherein a height level of an uppermost portion of the interlayer insulation film is lower than that of an uppermost portion of the N-type source region.

15. The device of claim 10, wherein a distance between the trenches at an upper surface of the mesa region is smaller than a distance between the trenches at a lower surface of the mesa region.

16. The device of claim 10, wherein a lower surface of the P-type highly doped body contact region is disposed between an upper surface and a lower surface of the N-type source region.

17. The device of claim 10, wherein a Zener diode is disposed between the gate electrode and the source metal.

18. A power semiconductor device comprising:
trenches formed in a semiconductor substrate;
a gate electrode disposed on a gate insulation film formed on an inner wall of each of the trenches;
a first conductivity type body region formed in the substrate and defined between each of the trenches;
a second conductivity type source region formed in a horizontal direction along an upper side surface of each trench and spaced apart from each other;
a first conductivity type highly doped body contact region formed horizontally on the source region and the body region; and
a source metal formed on the source region,
wherein the highly doped body contact region formed on the source region extends longer than the source region.

* * * * *